(12) United States Patent
Komatsubara (10) Patent No.: US 7,170,182 B2
(45) Date of Patent: Jan. 30, 2007

(54) SEMICONDUCTOR DEVICE WITH REDUCED INTERCONNECT CAPACITANCE

(75) Inventor: Hirotaka Komatsubara, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/812,959

(22) Filed: Mar. 31, 2004

(65) Prior Publication Data

US 2004/0232555 A1  Nov. 25, 2004

(30) Foreign Application Priority Data

May 19, 2003 (JP) .................. 2003-139729

(51) Int. Cl.
   *H01L 23/12* (2006.01)
   *H01L 23/48* (2006.01)
(52) U.S. Cl. ..................... 257/775; 257/774
(58) Field of Classification Search ........ 257/774–775, 257/758; 438/574, 579

See application file for complete search history.

(56) References Cited

U.S. PATENT DOCUMENTS 6,469,392 B2 * 10/2002 Park et al. .................. 257/775

FOREIGN PATENT DOCUMENTS

| JP | 02-001917 | | 1/1990 |
|---|---|---|---|
| JP | 04023327 A | * | 1/1992 |
| JP | 05-109912 | | 4/1993 |
| JP | 06-204350 | | 7/1994 |
| JP | 09-064182 | | 3/1997 |

* cited by examiner

*Primary Examiner*—Theresa T. Doan
(74) *Attorney, Agent, or Firm*—Rabin & Berdo, PC

(57) ABSTRACT

A semiconductor device has interconnecting lines disposed side by side in a dielectric film. Mutually adjacent pairs of interconnecting lines are separated by a substantially constant distance from top to bottom, but the width of each interconnecting line varies from top to bottom. For example, the interconnecting lines may have T-shaped or trapezoidal cross sections, interconnecting lines having wide tops alternating with interconnecting lines having wide bottoms. These cross-sectional shapes can be formed by simple fabrication processes. Since the facing sides of mutually adjacent interconnecting lines do not form mutually parallel vertical planes and therefore do not function as parallel plate electrodes, the interconnect capacitance is reduced.

5 Claims, 7 Drawing Sheets

SEMICONDUCTOR DEVICE WITH REDUCED INTERCONNECT CAPACITANCE

BACKGROUND OF THE INVENTION

1. Field of the Invention

The present invention relates to a semiconductor device, more particularly to a semiconductor device with reduced capacitance between interconnecting lines, and to methods of fabricating such a semiconductor device.

2. Description of the Related Art

Figure 6:
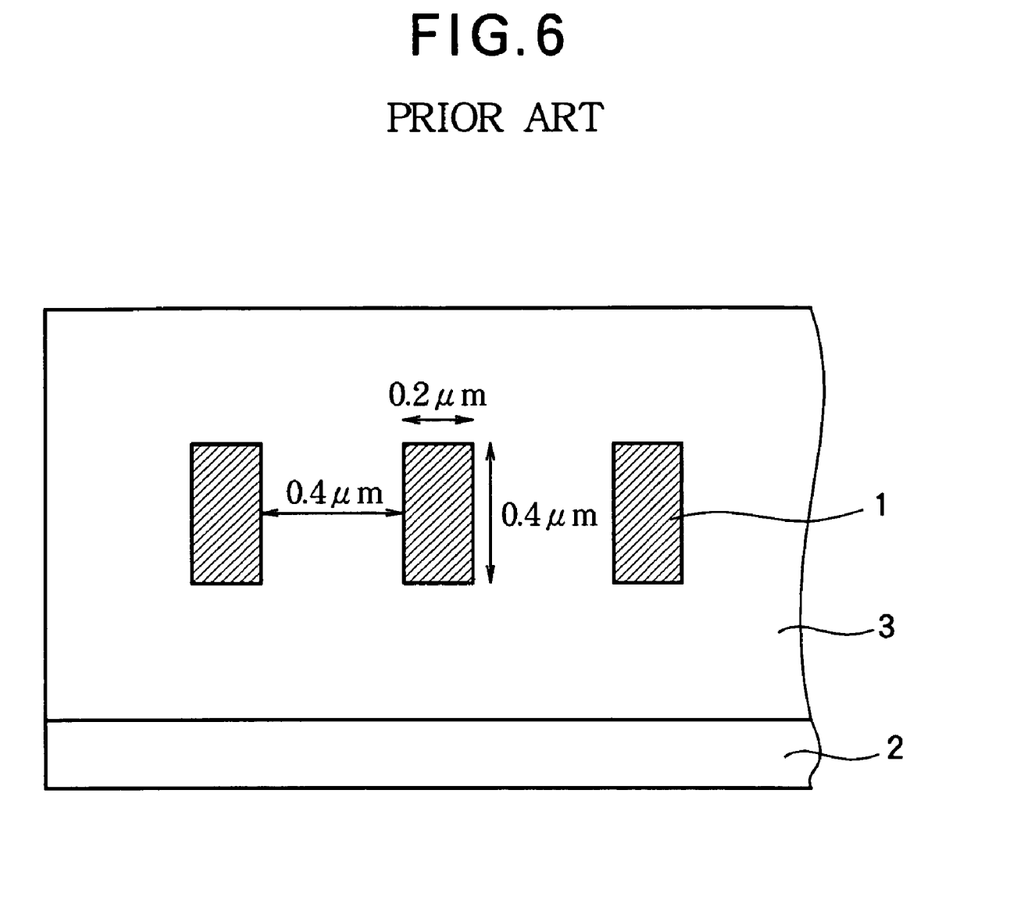
FIG. 6 is a sectional view of an interconnecting layer in the prior art.

As shown in FIG. 6, the interconnecting lines 1 in a conventional semiconductor device, which are embedded in an inter-layer dielectric film 3 formed on a lower wiring layer 2, generally have a rectangular cross-sectional shape. As the facing sides of adjacent interconnecting lines are mutually parallel, they act as parallel plate electrodes, producing considerable electrostatic capacitance between adjacent lines. This so-called interconnect capacitance adversely affects circuit operation.

In Japanese Unexamined Patent Application Publication No. H09-064182, the interconnect capacitance is reduced by giving the interconnecting lines the cross-sectional shape of a parallelogram or ellipse, thereby increasing the distance between the facing sides of adjacent interconnecting lines. Giving the interconnecting lines the cross-sectional shape of a parallelogram, however, requires directional etching in a diagonal direction from the resist film, with attendant problems of poor etching accuracy. For interconnecting lines with an elliptical cross-sectional shape, no detailed description of the etching method is given; practical fabrication is presumably difficult.

In Japanese Unexamined Patent Application Publication No. H06-204350, interconnect capacitance is reduced by cutting away facing corners in the upper or lower parts of adjacent interconnecting lines to widen the distances between those parts of the facing sides. However, the cross-sectional area is reduced by the amount cut away, causing a problem of increased line resistance.

In Japanese Unexamined Patent Application Publication No. H05-109912, interconnect capacitance is reduced by giving the interconnecting lines tapered sides, so that the cross-sectional shape is a trapezoid, the facing sides of adjacent interconnecting lines sloping away from each other. The taper also reduces the cross-sectional area of the interconnecting lines, however, again causing a problem of increased line resistance.

SUMMARY OF THE INVENTION

An object of the present invention is to provide a semiconductor device with reduced interconnect capacitance, which can be fabricated easily and requires no reduction of the cross-sectional areas of interconnecting lines.

The invention provides a semiconductor device with a plurality of interconnecting lines disposed side by side in a dielectric film. The width of each interconnecting line varies from the top to the bottom of the interconnecting line, but each mutually adjacent pair of interconnecting lines is separated by a substantially constant distance from top to bottom.

These requirements imply that the facing sides of mutually adjacent interconnecting lines do not form mutually parallel vertical planes and therefore do not function as parallel plate electrodes. The interconnect capacitance is reduced accordingly.

The interconnecting lines may have cross-sectional T shapes. In this case, interconnecting lines having upright T shapes preferably alternate with interconnecting lines having inverted T shapes. More specifically, each interconnecting line has an upper part and a lower part, the upper and lower parts having constant but different widths. Interconnecting lines in which the upper part is wider than the lower part preferably alternate with interconnecting lines in which the lower part is wider than the upper part. The upper and lower parts preferably have equal heights. Both heights are preferably equal to one-half the height of the interconnecting lines, so that the upper and lower parts of each interconnecting line make up the totality of the interconnecting line.

Alternatively, the interconnecting lines may have trapezoidal shapes. The trapezoidal shapes are preferably bilaterally symmetrical. In this case, each interconnecting line has a top width that differs from its bottom width, and interconnecting lines in which the top width is greater than the bottom width preferably alternate with interconnecting lines in which the bottom width is greater than the top width.

The invention also provides fabrication methods for the invented semiconductor devices.

A semiconductor fabrication method for forming interconnecting lines having T-shaped cross sections in a semiconductor substrate comprises the following steps:

forming first openings in a first dielectric film masked with a first resist film, for alternately embedding lower parts of interconnecting lines with inverted T shapes and lower parts of interconnecting lines with upright T shapes;

depositing wiring metal on the whole surface of the first dielectric film, including the openings;

planarizing the surface to form the lower parts of the interconnecting lines;

depositing a second dielectric film on the whole surface of the first dielectric film;

masking the second dielectric film with a second resist film and forming second openings in the second dielectric film, for alternately embedding upper parts of the interconnecting lines with inverted T shapes and upper parts of the interconnecting lines with upright T shapes;

depositing further wiring metal on the whole surface of the second dielectric film, including the second openings;

planarizing the surface to form the upper parts of the interconnecting lines; and depositing a third dielectric film on the whole surface of the second dielectric film.

A semiconductor fabrication method for forming interconnecting lines having trapezoidal cross sections comprises the following steps:

depositing a first dielectric film;

depositing first wiring metal on the whole surface of the first dielectric film;

forming interconnecting lines having a cross-sectional trapezoidal shape with a top width shorter than a bottom width by masking parts of the wiring metal that will become top parts of the interconnecting lines with a first resist film and etching the first wiring metal;

depositing a second dielectric film on the whole surface of the first dielectric film, including top parts of the interconnecting lines that have been formed;

planarizing the surface of the second dielectric film to expose the top parts of the interconnecting lines;

forming openings in the second dielectric film for embedding interconnecting lines having a trapezoidal shape with a bottom width shorter than a top width in positions alternating with the interconnecting lines having a top width shorter than a bottom width;

depositing further wiring metal on the whole surface of the second dielectric film, including the openings;

planarizing the surface of the further wiring metal to remove the metal from above the openings, leaving the interconnecting lines embedded in the openings; and depositing a third dielectric film on the whole surface of the second dielectric film, including the interconnecting lines.

DETAILED DESCRIPTION OF THE INVENTION

Embodiments of the invention will now be described with reference to the attached drawings, in which like elements are indicated by like reference characters.

Figure 1:
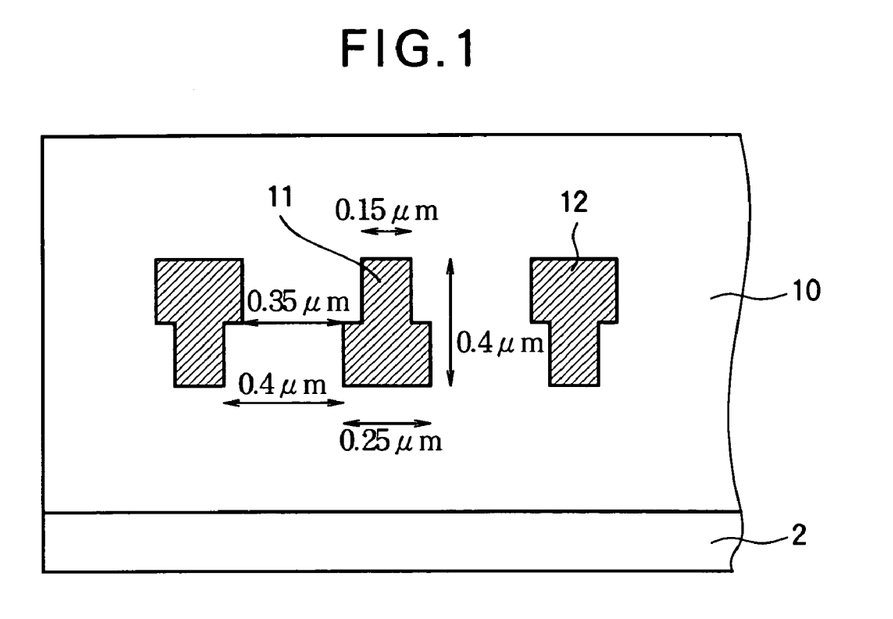
FIG. 1 is a sectional view illustrating a first embodiment of the invention.

Referring to FIG. 1, a first embodiment has interconnecting lines 11, 12 disposed in a dielectric film 10 formed on a lower wiring layer 2 as in the prior art, but differs in regard to the cross-sectional shape of the interconnecting lines 11, 12: interconnecting line 11 has an inverted T-shape; interconnecting line 12 has an upright T-shape. For purposes of comparison with the prior art, it will be assumed that a plurality of interconnecting lines 11, 12, all having cross-sectional areas equal to the cross-sectional areas of the interconnecting lines 1 in FIG. 6, are disposed at equal intervals in the same plane.

In the first embodiment, interconnecting lines 11 having an inverted T-shaped cross section alternate with interconnecting lines 12 having an upright T-shaped cross section in the dielectric film 10. That is, a plurality of T-shaped interconnecting lines with a first width and a longer second width are disposed side by side in the dielectric film so that the shorter width of one interconnecting line faces the longer width of the adjacent interconnecting lines.

Figure 2:
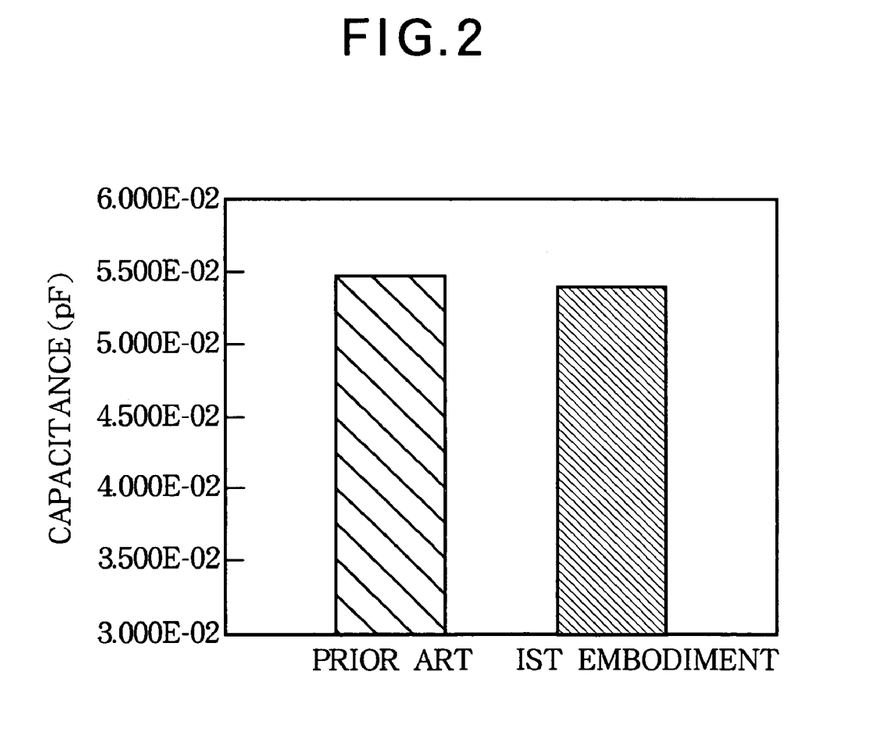
FIG. 2 compares interconnect capacitances in the first embodiment and the prior art.

FIG. 2 compares the interconnect capacitance resulting from the first embodiment and the prior art; the vertical axis represents capacitance in picofarads (pF) in floating-point notation. The value of the interconnect capacitance in the first embodiment is derived from simulation based on the numerical values shown in FIG. 1; the value of the interconnect capacitance in the prior art is derived from simulation based on the numerical values shown in FIG. 6. The first embodiment reduces interconnect capacitance by approximately three percent (3%) as compared with the prior art.

The distance between the side of an interconnecting line and the facing side of an adjacent interconnecting line, which corresponds to the distance between two adjacent parallel plate electrodes, is generally 0.4 µm in both FIG. 1 and FIG. 6; the total separation between the facing sides in FIGS. 1 and 6 can be considered to be the same.

In the first embodiment, the step discontinuities of the inverted T-shape of interconnecting lines 11 and the upright T-shape of interconnecting lines 12 are thought to be the cause of the reduced interconnect capacitance. It can also be understood that the increase in the inter-layer capacitance between the interconnecting lines 11 having the inverted T-shape and the lower wiring layer 2 reduces the relative interconnect capacitance between the facing sides of interconnecting lines 11 and 12.

FIGS. 3A to 3H are sectional views illustrating a fabrication process for the first embodiment.

Figure 3A:
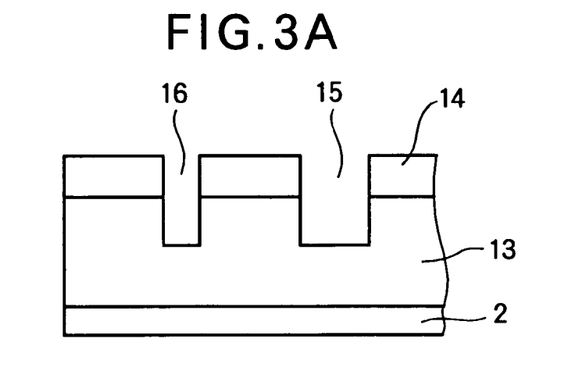
FIGS. 3A to 3H are sectional views illustrating the fabrication of the first embodiment.

As shown in FIG. 3A, first, the lower wiring layer 2 is formed and a dielectric film 13 is deposited by well-known methods.

A resist film 14 is formed on the dielectric film 13; then comparatively wide openings 15 and comparatively narrow openings 16 are formed in alternate positions by photolithography and etching. The openings 15, 16 have the general shape of elongate rectangular trenches, shown in cross section in FIG. 3A. The comparatively wide openings 15 will accommodate the lower parts of the interconnecting lines 11 with an inverted T-shaped cross section; the comparatively narrow openings 16 will accommodate the lower parts of the interconnecting lines 12 with an upright T-shaped cross section.

Figure 3B:
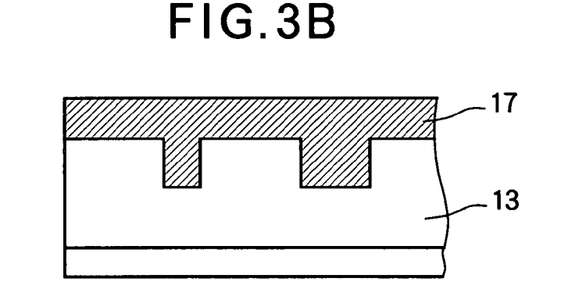

In FIG. 3B, the resist film 14 is removed; then wiring metal 17 is deposited on the whole surface of the dielectric film 13, filling in the openings 15, 16.

Figure 3C:
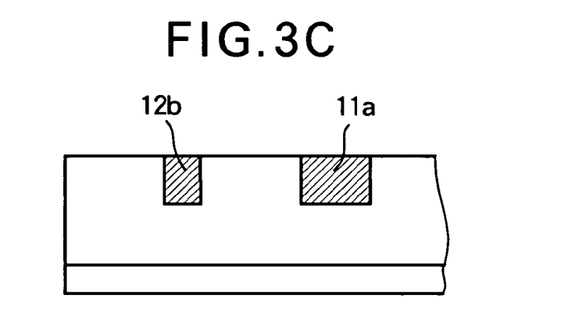

In FIG. 3C, the surface is planarized by chemical-mechanical polishing (CMP) or another appropriate method to remove the metal above the openings and leave the lower parts 11a, 12b of the interconnecting lines 11, 12.

Figure 3D:
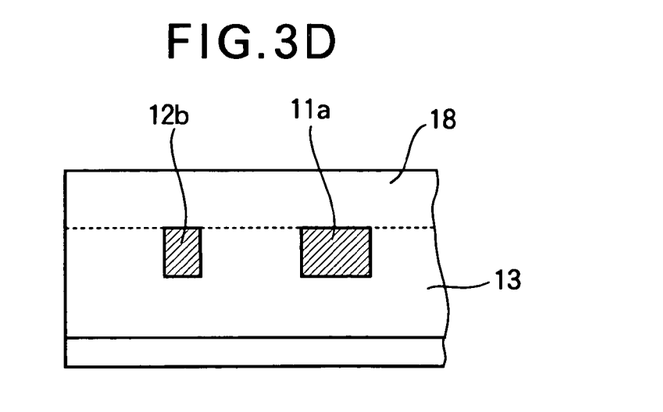

In. FIG. 3D, a further dielectric film 18 is deposited on the planarized surface inter-layer dielectric film 13, including the lower parts 11a, 12b of the interconnecting lines.

Figure 3E:
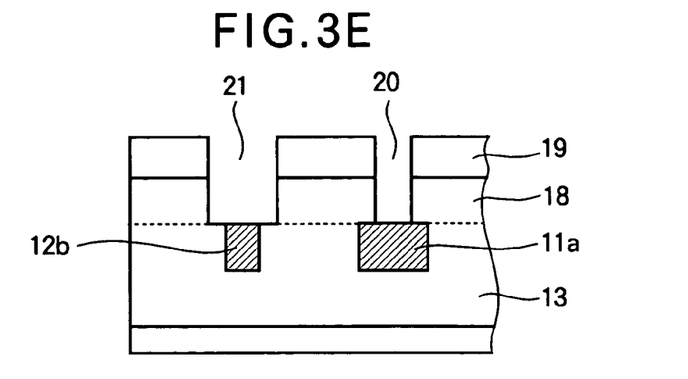

In FIG. 3E, a resist film 19 is formed on the dielectric film 18; then comparatively narrow openings 20 and comparatively wide openings 21 are formed by photolithography and etching. The comparatively narrow openings 20 extend down to the lower parts 11a of the interconnecting lines 11 with an inverted T-shaped cross section; the comparatively wide openings 21 extend down to the lower parts 12b of the interconnecting lines 12 with an upright T-shaped cross section.

Figure 3F:
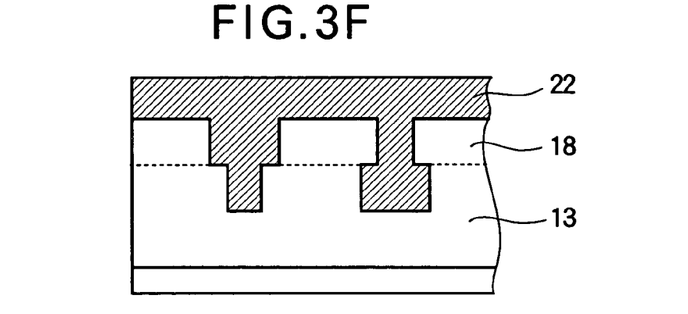

In FIG. 3F, the resist film 19 is removed; then wiring metal 22 is deposited on the whole surface, filling the openings 20, 21.

Figure 3G:
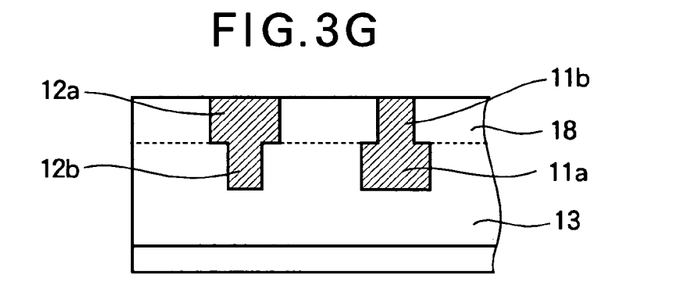

In FIG. 3G, the surface is planarized by CMP or another applicable method to remove the metal above the openings, leaving the upper parts 11b, 12a of the interconnecting lines 11, 12.

Figure 3H:
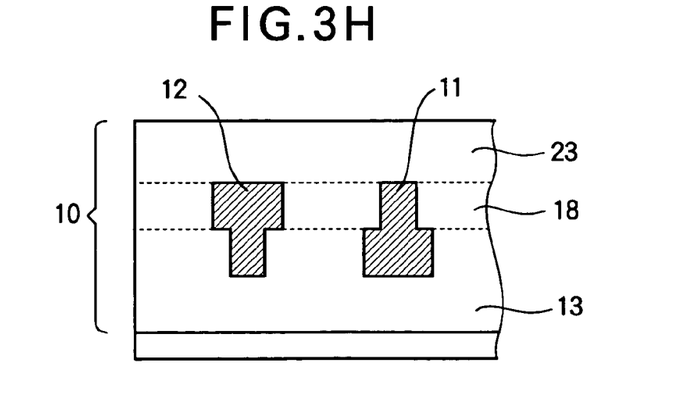

In FIG. 3H, another dielectric film 23 is formed on the whole surface, covering the upper parts of the interconnecting lines 11, 12. The three dielectric films 13, 18, 23 combine to form a single inter-layer dielectric film 10, completing the interconnecting line structure shown in FIG. 1.

The deposition, photolithography, and etching techniques used in the above described process are all well known; no new or special techniques are required to form the T-shaped cross sections.

The above process fabricates a single-layer interconnecting line structure, but it goes without saying that the process can be repeated to fabricate multi-layer interconnecting line structures.

By alternating interconnecting lines having an inverted T-shape and interconnecting lines having an upright T-shape as described above, the first embodiment enables interconnect capacitance to be reduced by a simplified fabrication method, which can be repeated to form a multi-layer wiring structure. In addition, this embodiment does not reduce the cross-sectional areas of the interconnecting lines, so it causes no increase in line resistance.

Figure 4:
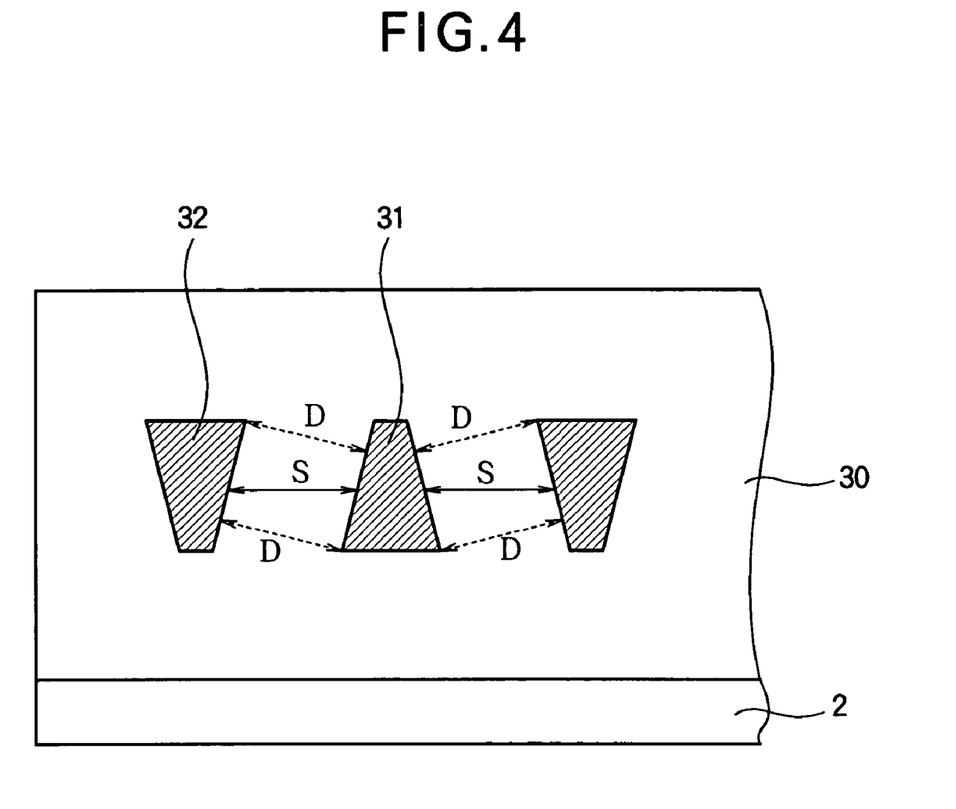
FIG. 4 is a sectional view illustrating a second embodiment of the invention.

Referring to FIG. 4, the second embodiment has interconnecting lines 31, 32 disposed in a dielectric film 30 deposited on a lower wiring layer 2 as in the prior art and the first embodiment, but differs in regard to the cross-sectional shape of the interconnecting lines 31, 32: interconnecting line 31 has a trapezoidal shape with a shorter upper width; interconnecting line 32 has a trapezoidal shape with a shorter lower width. For purposes of comparison with the prior art, it will be assumed that interconnecting lines 31, 32 all having cross-sectional areas equal to the cross-sectional areas of the interconnecting lines in FIG. 6, and are disposed at equal intervals in the same plane.

In the second embodiment, interconnecting lines 31 having a trapezoidal cross-sectional shape with a shorter upper width and interconnecting lines 32 having a trapezoidal cross-sectional shape with a shorter lower width are disposed alternately in the dielectric film 30. The trapezoidal shapes of both types of interconnecting lines 31, 32 are bilaterally symmetrical, and both types of interconnecting lines 31, 32 have the same height and the same maximum and minimum widths. Consequently, the separation between adjacent pairs of interconnecting lines 31, 32 remains constant from the top to the bottom of the interconnecting lines, despite the trapezoidal shape.

Since this structure reduces the area of the orthogonally facing parts of the sides of the interconnecting lines 31, 32, thus reducing the area of the parts that function as parallel plate electrodes, although the orthogonal separation D between the sides of the interconnecting line 31 and the facing sides of the adjacent interconnecting line 32 becomes a little shorter than the horizontal separation S, which is the same as in FIG. 6, the total interconnect capacitance is reduced.

FIGS. 5A to 5H are cross-sectional views illustrating a fabrication process for the second embodiment.

Figure 5A:
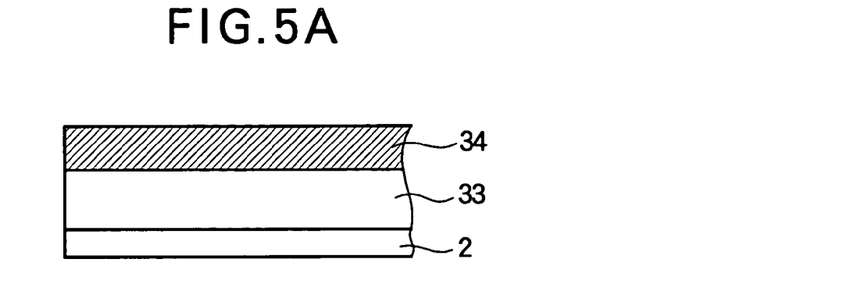
FIGS. 5A to 5H are sectional views illustrating the fabrication of the second embodiment.

As shown in FIG. 5A, first well-known methods are used to form a lower wiring layer 2, cover it with a dielectric film 33, and deposit wiring metal 34 on the whole surface of the dielectric film 33.

Figure 5B:
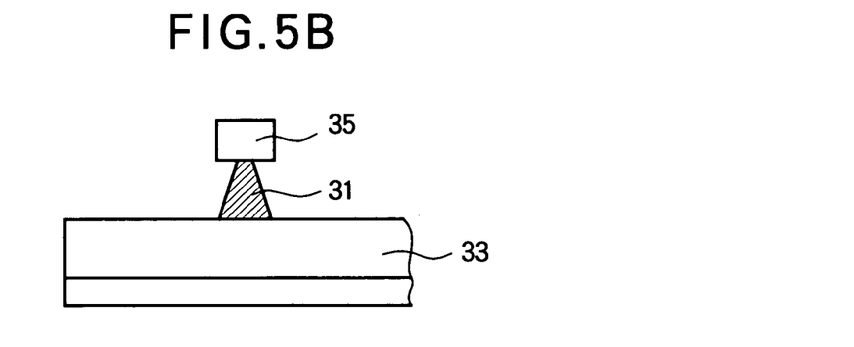

Next, in FIG. 5B, a resist film 35 is formed and patterned to cover those parts of the wiring metal 34 that will become interconnecting lines having a trapezoidal cross-sectional shape with a shorter upper width; then the wiring metal 34 is wet-etched to form these interconnecting lines 31.

Figure 5C:
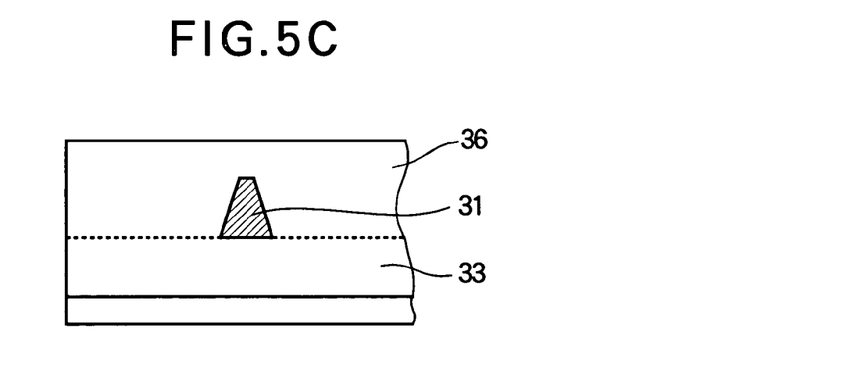
Figure 5D:
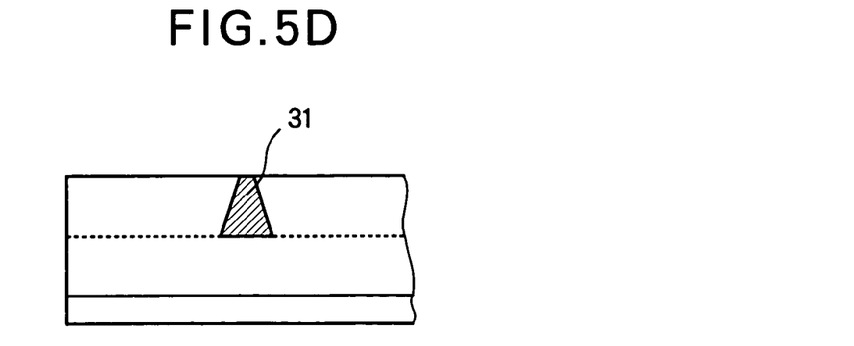

In FIG. 5C, the resist film 35 is removed, and another dielectric film 36 is deposited on the whole surface, covering the interconnecting lines 31. In FIG. 5D, the surface is planarized by CMP or another applicable method to expose the tops of the interconnecting lines 31.

Figure 5E:
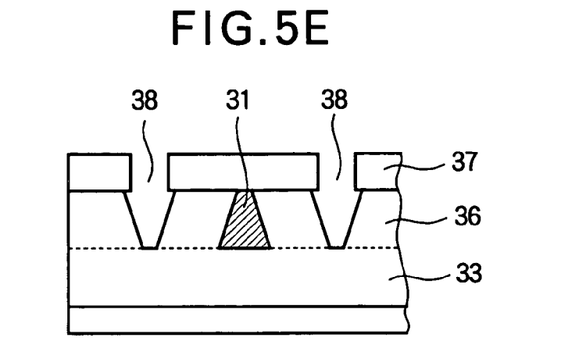

In FIG. 5E, a resist film 37 is formed on the planarized surface; then openings 38 for the interconnecting lines having a trapezoidal cross-sectional shape with a shorter lower width are formed by wet-etching, in positions that alternate with the positions of the interconnecting lines 31 having a trapezoidal cross-sectional shape with a shorter-upper width.

Figure 5F:
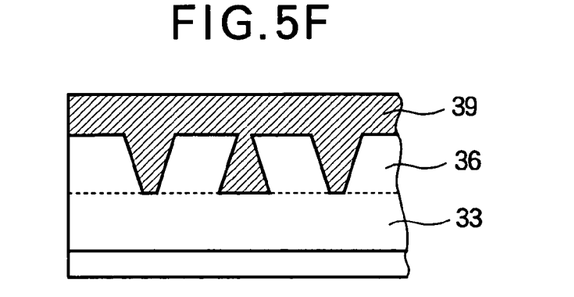
Figure 5G:
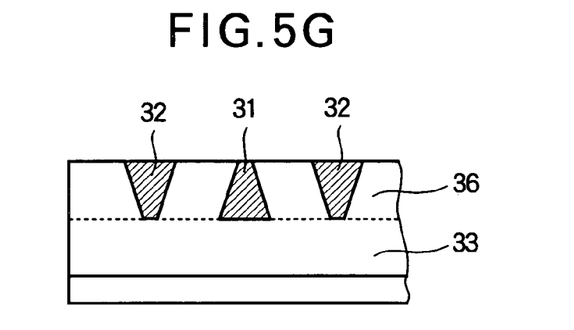
Figure 5H:
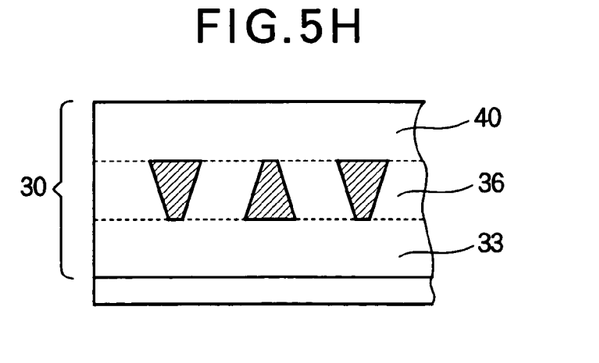

In FIG. 5F, the resist film 37 is removed, and wiring metal 39 is deposited on the whole exposed surface, filling the openings in dielectric film 36. In FIG. 5G, the surface is planarized by CMP or another applicable method to remove the metal above the openings, leaving the interconnecting lines 32 having a trapezoidal cross-sectional shape with a shorter lower width. In FIG. 5H, a further dielectric film 40 is deposited on the whole surface, covering the interconnecting lines 31, 32 and completing the interconnecting line structure of the second embodiment. The three dielectric films 33, 36, 40 combine to form the single inter-layer dielectric film 30 shown in FIG. 4.

The deposition, photolithography, and etching techniques used in the process described above are well known; no new or special techniques are required.

The above process fabricates a single-layer line structure, but it goes without saying that the process can be repeated to form a multi-layer line structure.

By alternating interconnecting lines having a trapezoidal shape with a shorter upper width and interconnecting lines having a trapezoidal shape with a shorter lower width as described above, the second embodiment enables the interconnect capacitance to be reduced by a simplified fabrication method, which can be repeated to form a multi-layer line structure. In addition, this embodiment does not reduce the cross sections of the interconnecting lines, so it causes no increase in line resistance.

Those skilled in the art will recognize that the embodiments and fabrication methods described above can be modified in various ways within the scope of the invention, which is defined by the appended claims.

What is claimed is:

1. A semiconductor device, comprising:
   a lower dielectric film;
   an upper dielectric film formed in contact with the lower dielectric film;
   a first interconnecting line having a first lower part formed in the lower dielectric film and a first upper part formed in the upper dielectric film, the first upper part making contact with the first lower part;
   a second interconnecting line having a second lower part formed in the lower dielectric film and a second upper part formed in the upper dielectric film, the second upper part making contact with the second lower part;
   wherein the first lower part and the second upper part have a first constant width;
   the second lower part and the first upper part have a second constant width greater than the first constant width; and
   the first interconnecting line and the second interconnecting line have a first height and the first upper part, the second upper part, the first lower part, and the second lower part have a second height equal to half the first height.

2. The semiconductor device of claim 1, wherein the first interconnecting line and the second interconnecting line are mutually adjacent.

3. The semiconductor device of claim 1, wherein the first upper part, the second upper part, the first lower part, and the second lower part are rectangular.

4. The semiconductor device of claim 3, wherein the first interconnecting line and the second interconnecting line have a cross-sectional T shape.

5. A semiconductor device, comprising:
   a lower dielectric film;
   an upper dielectric film formed in contact with the lower dielectric film;
   a first interconnecting line having a T-shape formed by a first vertical leg formed only in the lower dielectric film and a first horizontal leg formed only in the upper dielectric film, the first horizontal leg making contact with the first vertical leg;

a second interconnecting line having an inverted T-shape formed by a second horizontal leg formed only in the lower dielectric film and a second vertical leg formed only in the upper dielectric film, the second vertical leg making contact with the second horizontal leg;

wherein the first vertical leg and the second vertical leg have a same width, which is constant over an entire length of the respective vertical legs;

the second horizontal leg and the first horizontal leg have a same width, which is constant along the respective horizontal legs, the width of the horizontal legs being greater than the width of the vertical legs; and the first interconnecting line and the second interconnecting line have a first height, and the first vertical leg, the second vertical leg, the first horizontal leg, and the second horizontal leg each have a second height equal to half the first height, the heights being measured in a vertical direction, the widths being measured in a horizontal direction.

\* \* \* \* \*